(12) United States Patent
Ames et al.

(10) Patent No.: US 6,895,371 B1
(45) Date of Patent: May 17, 2005

(54) GEOMETRICAL MODELING OF STRUCTURAL PRODUCTS

(75) Inventors: Robert M. Ames, Columbia, MD (US); Richard VanEseltine, Laurel, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 847 days.

(21) Appl. No.: 09/659,844

(22) Filed: Sep. 11, 2000

(51) Int. Cl.[7] .......................... G06F 17/10; G06F 7/60
(52) U.S. Cl. ................. 703/1; 703/2; 703/8; 345/420; 345/421
(58) Field of Search ............................. 703/1, 2, 7, 8; 345/419–421

(56) References Cited

U.S. PATENT DOCUMENTS

| | | | | |
|---|---|---|---|---|
| 5,488,692 | A | * | 1/1996 | Karasick et al. ............. 345/420 |
| 5,581,672 | A | * | 12/1996 | Letcher, Jr. ................. 345/420 |
| 5,859,786 | A | * | 1/1999 | Klein ............................. 703/2 |
| 6,392,645 | B1 | * | 5/2002 | Han et al. .................... 345/420 |
| 6,816,819 | B1 | * | 11/2004 | Loveland ........................ 703/1 |
| 6,820,043 | B2 | * | 11/2004 | Mallet et al. .................. 703/2 |

OTHER PUBLICATIONS

US Pub. No. 2004/0236549 A1 to Dalton.*
Publication entitled "A Framework for Modeling Complex Structures" by Bob Ames and Richard VanEseltine in Hydrocdynamic Technology Center Symposium—Mar. 10, 1999.
Bob Ames and Dave Ferguson "Applications to Engineering Design of the General Geometry, Grid & Analysis Object in DT_NURBS", 5th International Conference on Numerical Grid Generation in CFD and Related Fields, Mississippi State Univ, Apr. 1–5, 1996 10 pages.
Myles M. Hurwitz, "Leading Edge Advanced Prototyping for Ships (LEAPS): An Integrating Architecture for Early Stage Ship Concept Assessment Software", 2nd ASNE Modeling, Simulation, and Virtual Prototyping Conference, Arlington, VA, Nov. 24–25, 1997, pp 135–141.

* cited by examiner

Primary Examiner—Anthony Knight
Assistant Examiner—Crystal J. Barnes
(74) Attorney, Agent, or Firm—Jacob Shuster

(57) ABSTRACT

Physical structures are represented by modeling as topological views having bounding elements related to connectors as mathematical algorithms to enable computational analysis and multi-discipline integration of such physical structures by computer aided design.

3 Claims, 11 Drawing Sheets

SOLIDS

UNTRIMMED SURFACES

TRIMMED SURFACES

GEOMETRICAL MODELING OF STRUCTURAL PRODUCTS

The present invention relates in general to computational modeling of geometric structures referred to in a prior application Ser. No. 09/109,725 filed Jul. 2, 1998, which was subsequently abandoned after filing of the present application.

BACKGROUND OF THE INVENTION

The representation of physical bodies using techniques associated with computational geometry or geometrical modeling, is already known in regard to design, visualization and manufacture of structural products or objects involving various limitations such as surface properties, shapes and part relationships. A lot of attention has been given to "Smart Product Models", "Simulation Based Design", "Integrated Design Environment", and "Integrated Product Data Environment". It has become evident that in "integrated environments" geometry plays a vital role as the common element in the design and analysis of complex systems. In essence, computational geometry is the closest data representation of the actual product of any piece of information. The form of geometric representation can determine the level of effort involved in generation of analysis data, the means to communicate the design for product review and mockup, and the ability to present the product for manufacturing. In essence, the "smart" product model more closely represents real products in function, form, performance, and physical characteristics.

In regard to the present invention, a technical publication entitled "Framework For Modeling Complex Structures" was published after the filing of the aforementioned copending parent application. Some of the content of such publication was extracted and transferred to the specification and drawings of the present application. The remainder of such publication is incorporated herein by reference, including terminology definitions.

SUMMARY OF THE INVENTION

In accordance with the present invention, geometric and polynomial elements are utilized to represent physical structures, modeled as topological views of analytic functions, whose bounding elements are related to connectors, defined in terms of mathematical algorithms to bounding elements of other topological views, whereby geometrical modeling, discretization for computational analysis, and multi-discipline integration of such structures may be performed by computer aided design involving computational techniques. The topological view of a structural model is formed with one outer element boundary together with one or more inner element boundaries for which unique physical and/or solution properties or attributes my exist. Inner boundaries which overlap or intersect with each other or with outer boundaries are excluded. Types of topological views include, but are not limited to, bounded surface regions with parametric edge element boundaries and bounded volume regions with bounded surface region element boundaries. Spatial relationships between boundary object elements, called connectors, are defined as algorithms of multi-dimensional functions or multidimensional mappings. Connections and topological views combine to create robust and spatially connected logical and functional structures along with their associative properties.

The present invention involves the role of related software developments in geometric modeling, discretization for computational analysis, and multi-discipline integration. Such developments provide a mathematical framework for geometry, grid data structures, analysis characterization, and behavior modeling. A new geometry topology framework provides a unique modeling capability to represent typical related geometry as well as provide more complete functionality for discretization, evaluation, and modeling of complex boundary representations. Also provided is the capability to facilitate the work of an integrated product team. A unique role of the foregoing software developments is performed in the design and analysis of complex structures.

BRIEF DESCRIPTION OF DRAWING

A more complete appreciation of the invention and many of its attendant advantages will be readily appreciated as the same becomes better understood by reference to the following detailed description when considered in connection with the accompanying drawing wherein.

DETAILED DESCRIPTION OF PREFERRED EMBODIMENTS

Figure 1:
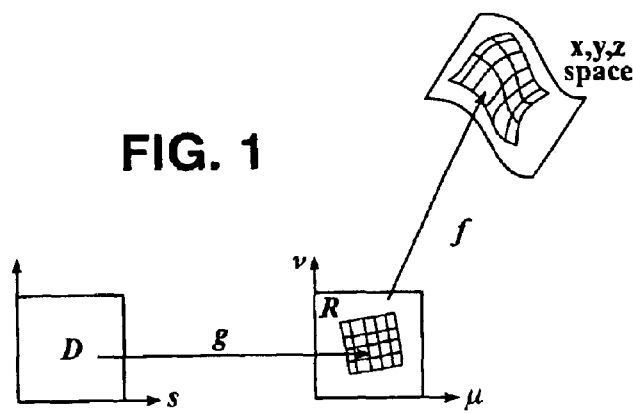
FIG. 1 is a composition functional diagram.

The present invention involves product modeling through use of representational methods based on the assumption that all disciplines need product model data; that a common required representation exists; and that the product model contains sufficient information to convey design intent and detail for all disciplines. A fundamental premise associated with such methods is that product model data is composed of geometry, performance and modeling process, applicable to design and engineering analysis, and that such a product model can be composed.

Characterization of shape, behavior and content are fundamental to the product modeling process. Correct shape representation is dependant on the ability to define connectedness of the structure through computational methods and not through visual reference. Pursuant to the present invention, use of mathematical methods and the relationships therebetween provides a framework for "smart" product model development necessary for multi-discipline integration in a fully capable design environment. The foregoing referred to framework consists of: (1) a Geometry and Engineering Mathematical Library (GEML) as a mathematical foundation for modeling; (2) Geometry Object Structure (GOBS) utilizing such mathematical foundation to build unique topologically connected models and allow for development of robust geometry necessary for smart product modeling; and (3) Leading Edge Advanced protyping For Ships (LEAPS) which involves a combination of GOBS modeling with property and performance data. The application of the aforesaid framework is the basis from which the environment for designing and assessing complex systems is created.

In regard to (1) GEML, which provides a mathematical basis for modeling, the object of such library is to: (a) develop, import, export, modify and evaluate spline based mathematics; (b) develop, modify, adapt, grid or mesh data with associated spline functions; and (c) store resultant geometry, grid, and analysis data in a common framework with dependencies maintained. Using these objects, a GEML based framework contains and controls all information relating to geometry, grids, and analysis. Since analysis is dependent on grids, and grids on geometry, the coupling of these elements in an object oriented data structure is accommodated. GEML provides for flexible representation and object dependency. It includes such features as geometry varying with time; mapped geometry; grids defined in the geometry domain, and n-dimensional functions for analysis characterization and behavior modeling.

In order to model geometry, grids, and analysis data it is necessary to have a mathematical basis with facilitates representation of all three and allow for both implicit and explicit coupling of the data. A fundamental element in GEML is the notion of n-dimensional spline functions, combined with composition, select, and affine functions. N-dimensional splines in GEML allows for the modeling and interpolation of any number of geometric and analysis variables; and by any number of independent parameters such as time, frequency, or iteration. Such N-dimensional splines are the building block for dynamic, variational geometry and representation of analysis data as a function. N-dimensional analysis functions are also ideally suited for use as performance behavior models. Consider a traditional spline surface and representation thereof extended by GEML to N-dimensions, as respectively depicted in the followings equations (1) and (2):

$$(x, y, z) = f(u, v)$$

Equation 1—Traditional CAD Surface vs. GEML $$(x, y, z, Vx, Vy, Vz, Cp, temp, \ldots) = g(u, v, time, \ldots)$$

Equation 2–GEML N-Dimensional Function

Of the GEML functions, the spline and composition functions provide the essential building blocks for geometry and analysis characterization and coupling. Additionally, the ability to map such functions to each other extends affords flexibility by removing parametric issues as a modeling constraint.

Consider an example wherein a surface is mapped to another surface. In this example, the mapping of one geometry to another is described by the composition of two functions. The first, parent geometry, is represented as a tensor product spline. The second, a mapped function, is also a tensor product spline entity, but its range is in the domain of the parent geometry. Composition functions are not limited by the dimensionality of the parent or base function. In the case of a typical CAD surface, $(x,y,z)=f(u,v)$, the parent representation would not allow for the inclusion of the notion of a surface changing with time. GEML, because of its non-dimensional nature, adds the ability to represent the parent geometry as a surface changing with time, i.e. $(x,y,z)=f(u,v,time)$. Thus, the domain of the parent geometry is an n-dimensional cube R. The domain of the mapped surface function is another n-dimensional cube D. In such case, the mapped surface will not change in its location on the parent surface but its 3D image will change as the parent changes.

The foregoing reference to this geometry model is depicted in FIG. 1 where the mapping $f: R \rightarrow E^3$ is the parent geometry of the particular surface component and $g: D \rightarrow R$ is a surface mapping defining the relevant piece of the parent geometry. The notion of a composition of function arises from the mapping of one function with another such that the evaluation of that combined function behaves in a fashion similar to a chain rule.

The foregoing concept may be extended by forming a composition function which maps analysis data to geometry. Such mapping giving the ability to interrogate the relationship between performance and geometry because they are directly related and dependent.

A single n-dim function could contain; (x, y, z, Vx, Vy, Vz, Cp, temp)=g(u, v, time)

Now suppose we separate the geometry out and (x, y, z)=f(u, v)

create a second function containing the analysis data. (u, v, Vx, Vy, Vz, Cp, temp)=g(s, t)

Figure 2:
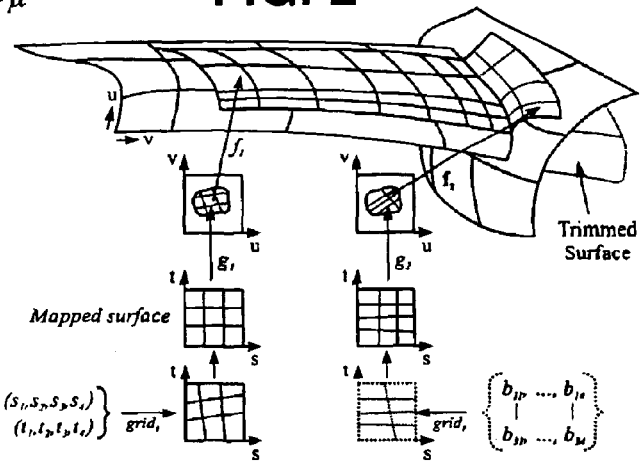
FIG. 2 is a surface and grid mapping diagram.
Figure 3:
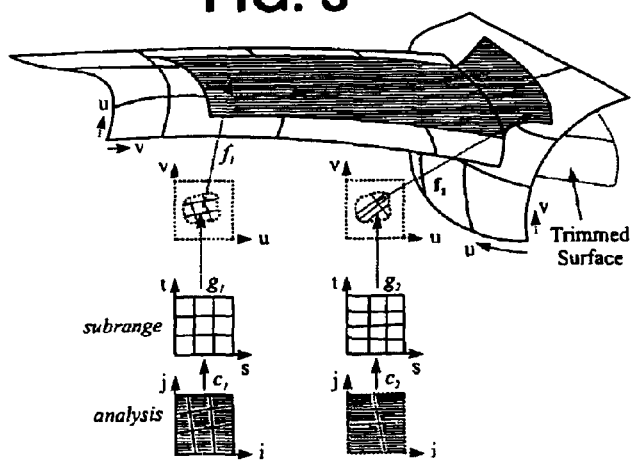
FIG. 3 is a surface and solution data mapping diagram.

By composing functions we perform the following;

$f: (u, v) \rightarrow (x, y, z)$ and $g: (u, v, r1, r2, r3) \rightarrow (s, t)$ $f \circ g(s,t) \rightarrow (x, y, z, r1, r2, r3)$ The notation $f(x)$ means "function $f$ composed with function $g$." and could be written as $f(g(x))$ The foregoing example demonstrates that n-dimensional splines and composition functions allow for the use of mapping from space to space. A surface can lie on another surface, a volume is contained within a volume, or a function can define the relationship between two discrete curves, surfaces, or volumes. A mapped surface may be gridded independent of the parent geometry to change with any parameter if necessary as shown in FIG. 2. By including the n-dimensional mapped functions, grid can be evaluated and the solution set returned and interpolated as a spline mapped to the geometry as in FIG. 3.

In regard to (2) GOBS, a new model for the construction, representation, and interrogation of complex product models is provided. The GOBS model purports that product model data is defined and represented as a 'view' of implicit and explicit geometric and analytic entities.

Figure 4:
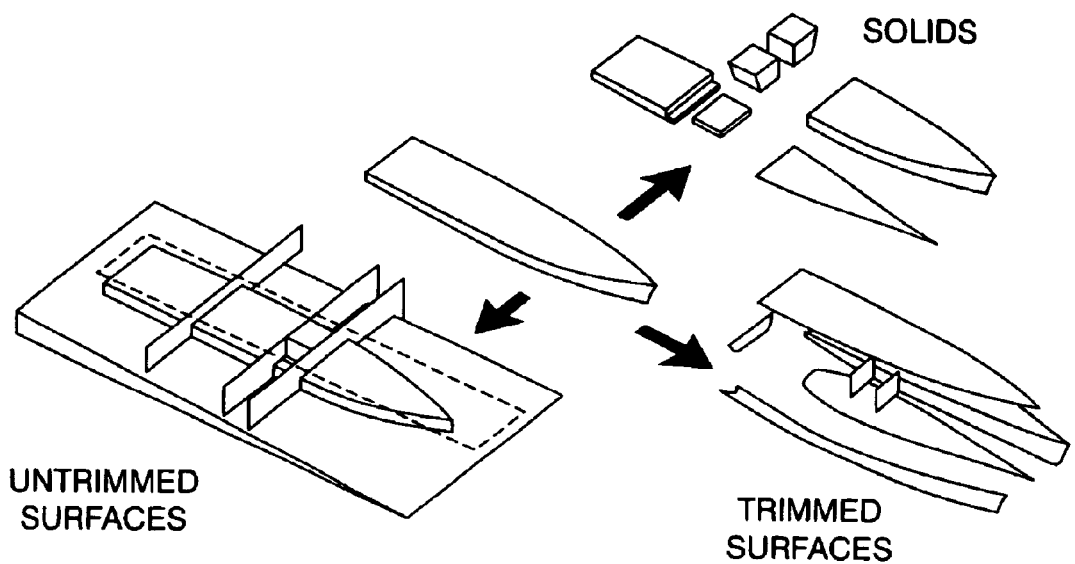
FIG. 4 is a representation of multiple topology geometry.

Views are compositions of entities whose relationships and attribute associations define the entity. This is contrary to most representations where the geometry defines the view and the object simultaneously. FIG. 4 depicts multiple geometry representations typical in product modeling as performed using computer aided design (CAD). The geometry depicted illustrates the many forms used in CAD systems today; which contain the same mathematical basis, but the use of which topology of the model can vary widely. Each topology has benefits and constraints in product modeling but none correctly represents real physical structure. For example, a typical CAD b-rep solids representation treats the ship depicted in FIG. 4 as a collection of solid blocks each containing its own entities without knowledge of its relationship to the other entities. The more common product model representation using trimmed surfaces generally provides the most visually correct representation but looses all associations between surfaces. For example, there is no knowledge about the relationship between hull and deck and that the two adjacent surfaces are connected. The topology model based on GOBS provides the means to resolve such issues. Geometric entities can be explicitly connected by their edges and discretization can occur across faces while simultaneously resolving parameterization issues across boundaries. Using these connections in combination with topological views, both solid and surface views can exist simultaneously while adding knowledge of product structure relationships.

Figure 5:
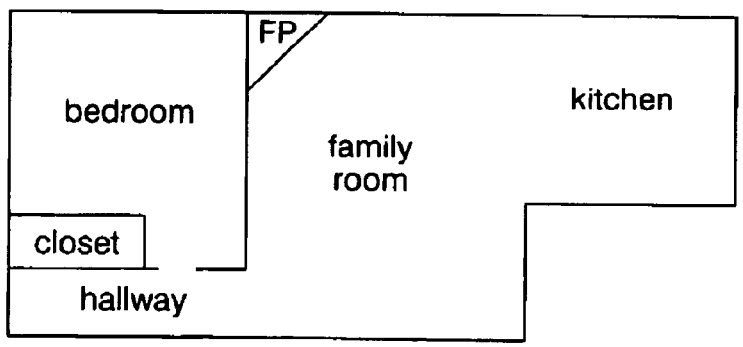
FIG. 5 is a house arrangement diagram.
Figure 6:
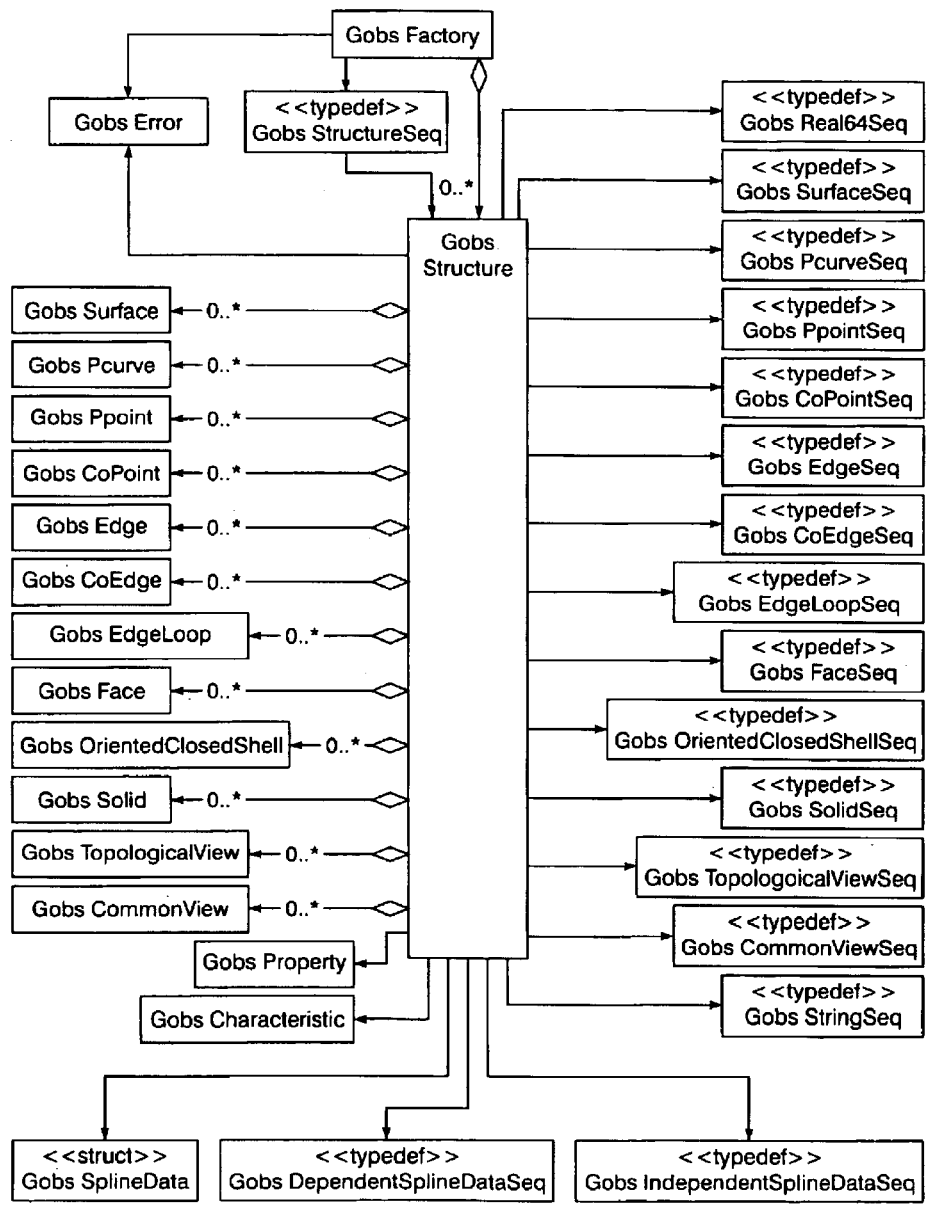
FIG. 6 is a GOBS Unified Modeling Language diagram of the Structure class.
Figure 7:
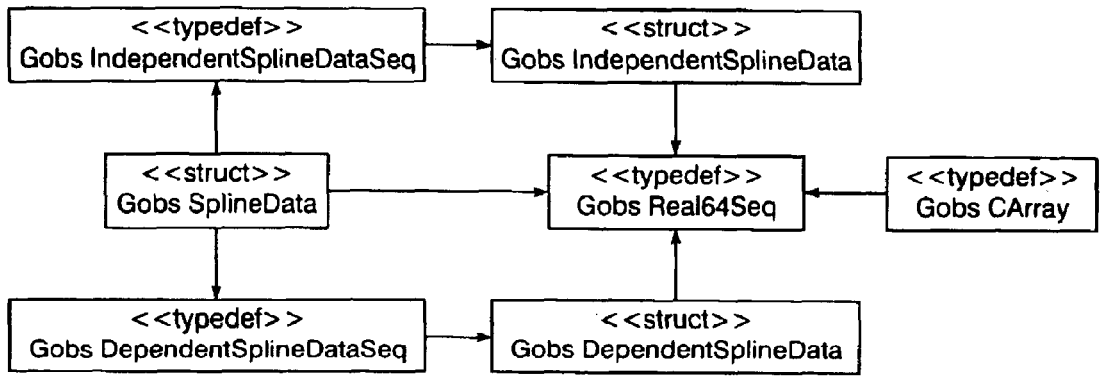
FIG. 7 is a GOBS Unified Modeling Language diagram of the Spline class.
Figure 8:
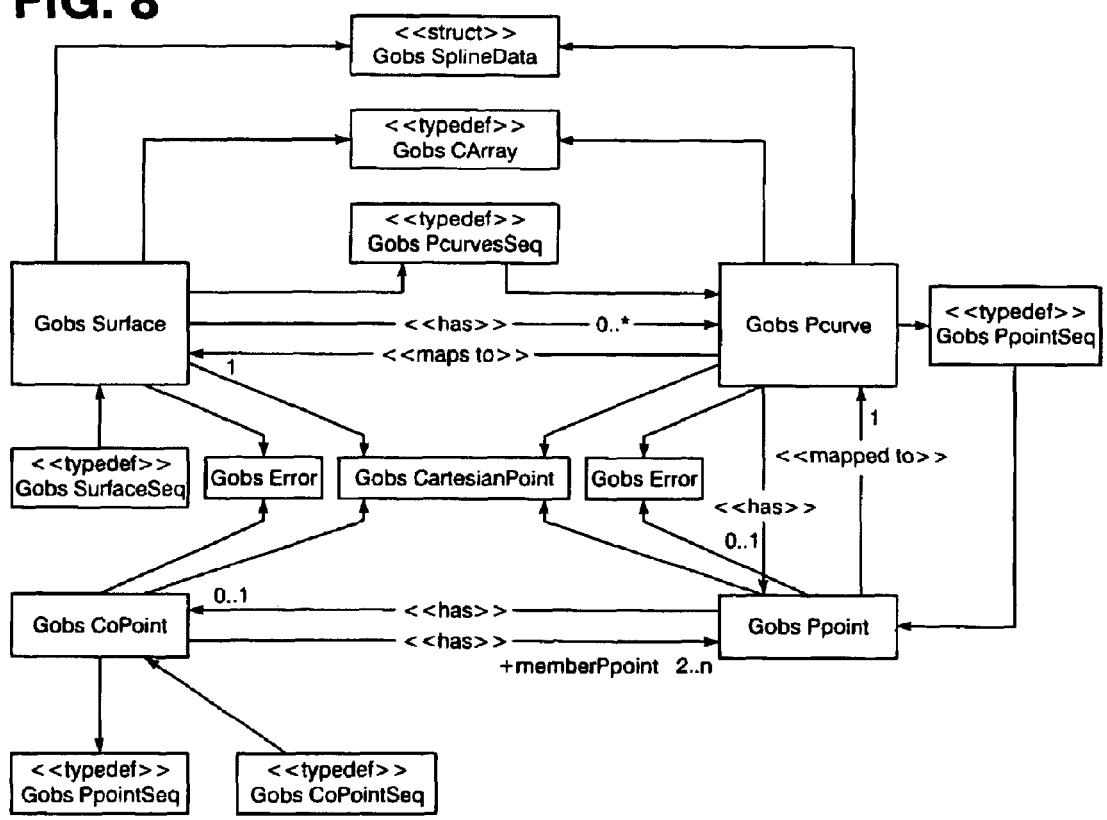
FIG. 8 is a GOBS Unified Modeling Language diagram of the Surfaceclass.
Figure 9:
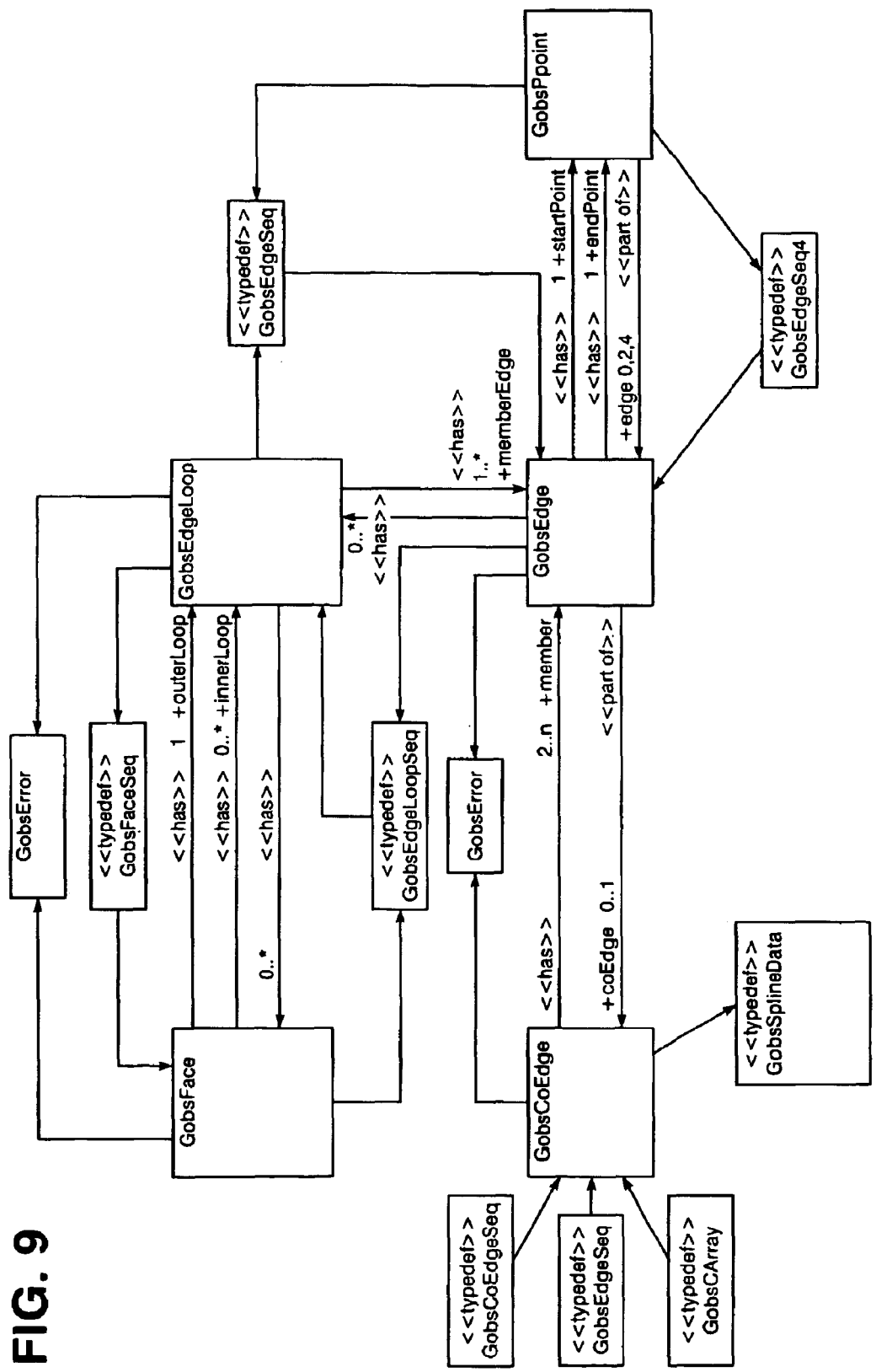
FIG. 9 is a GOBS Unified Modeling Language diagram of the Face class.
Figure 10:
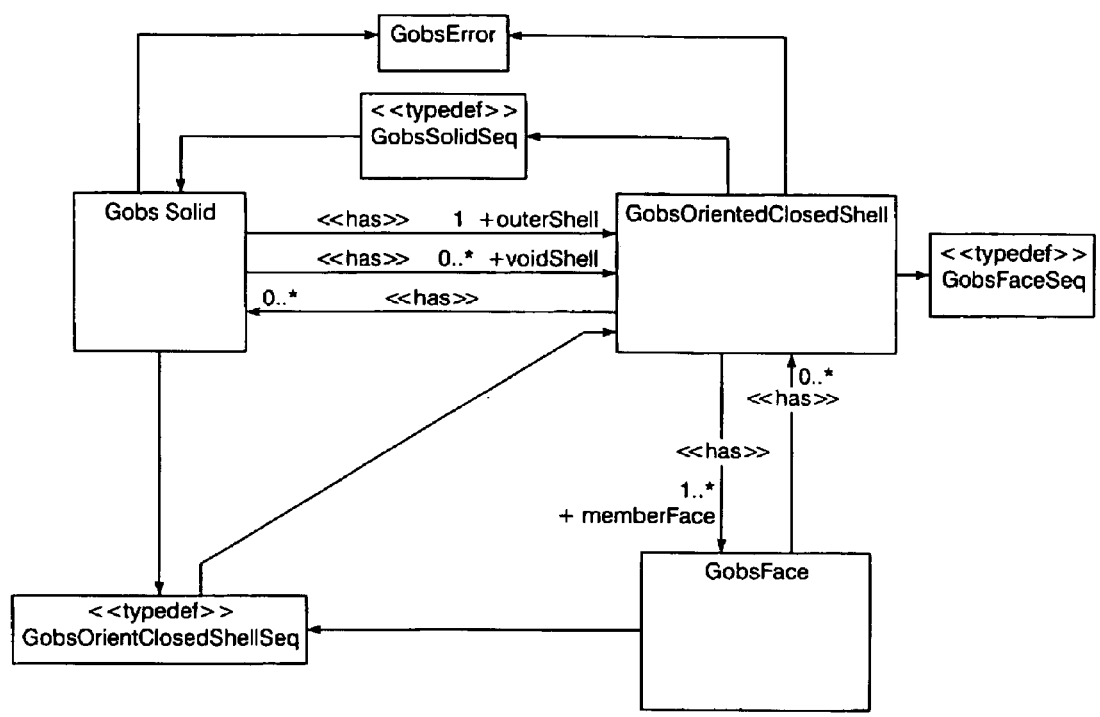
FIG. 10 is a GOBS Unified Modeling Language diagram of the Solid class.
Figure 11:
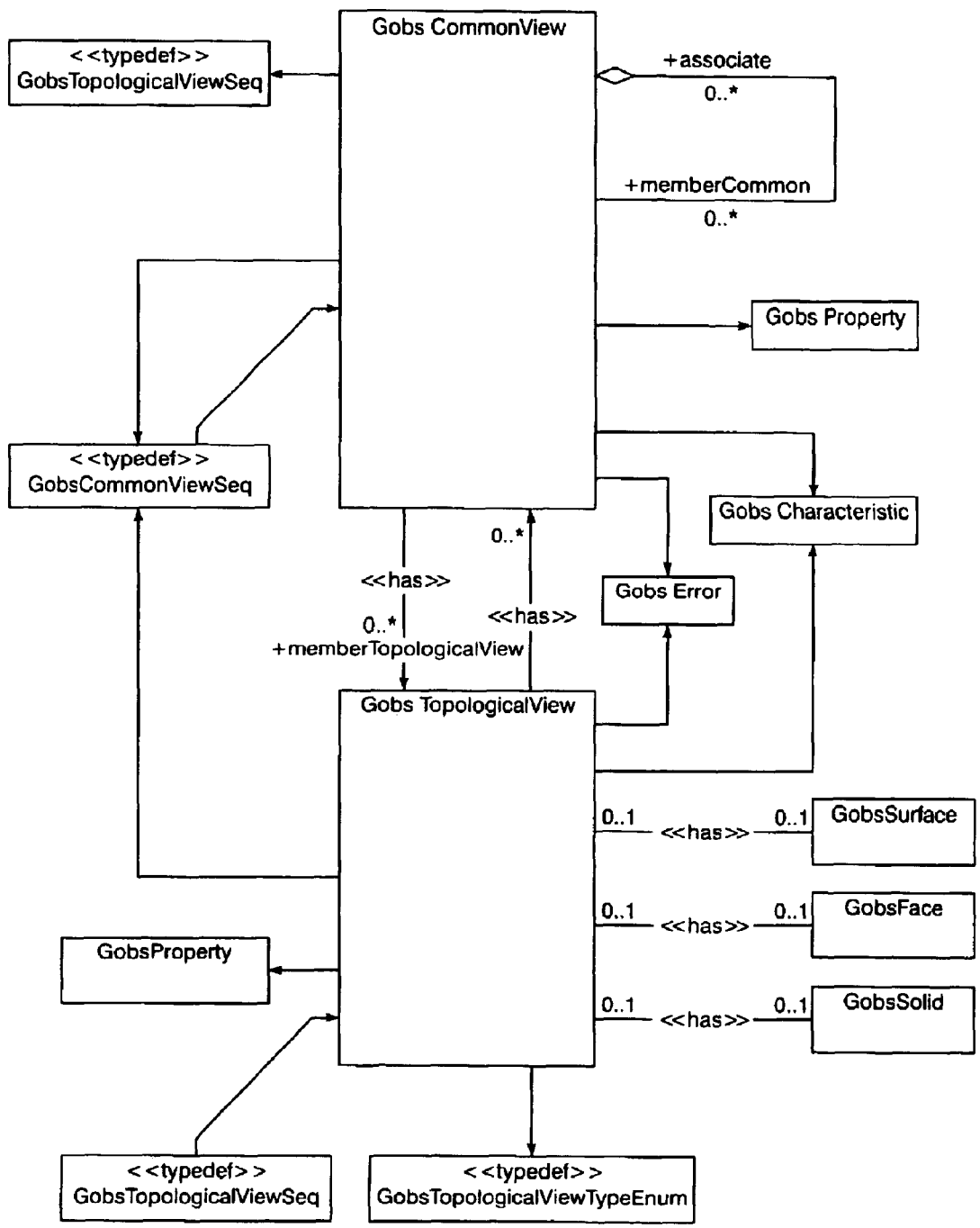
FIG. 11 is a GOBS Unified Modeling Language diagram of the Topological View class.
Figure 12:
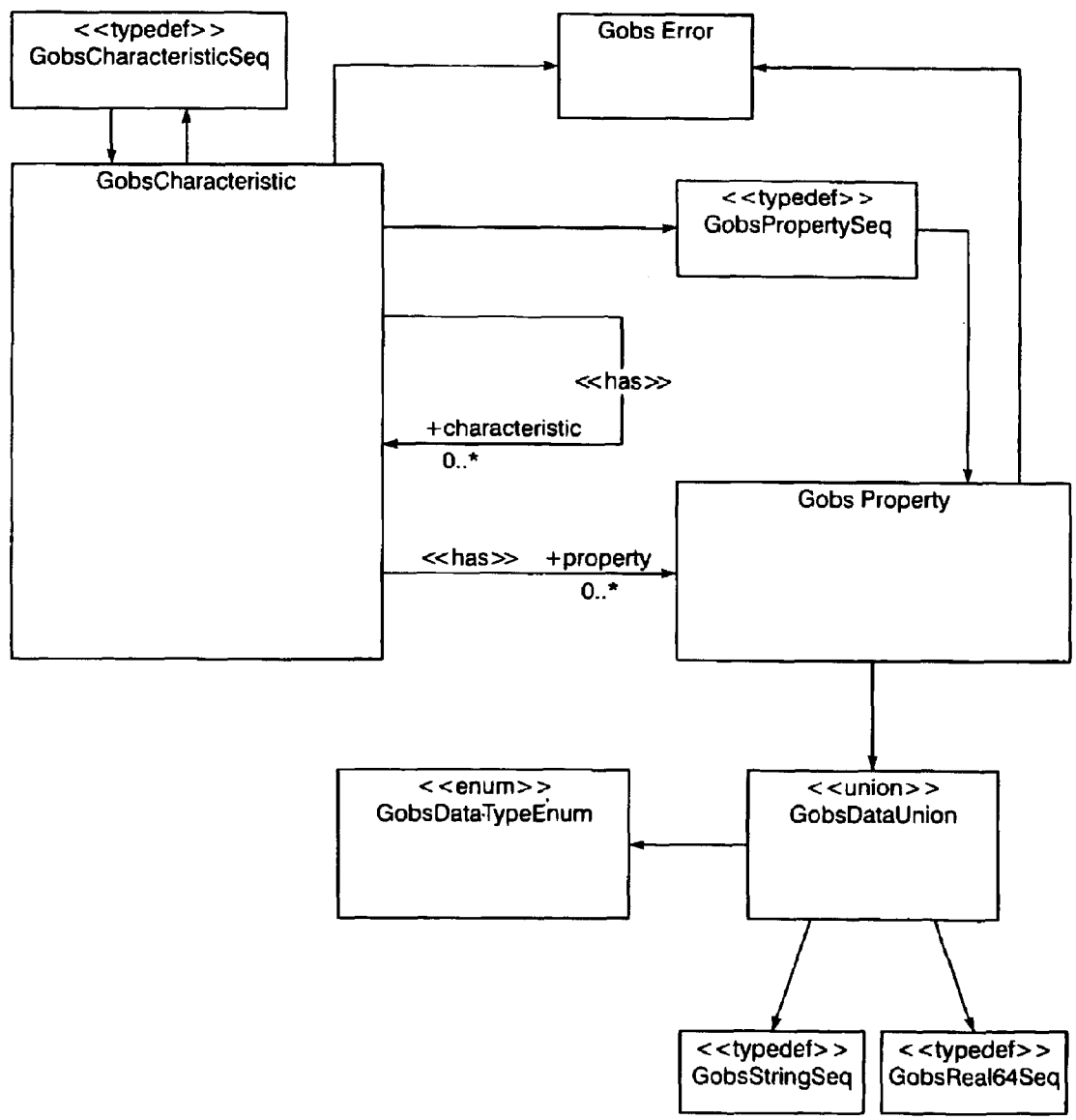
FIG. 12 is a GOBS Unified Modeling Language diagram of the Property class.

Another example of GOBS topology is illustrated in FIG. 5 with a universally understood example. Here we have the common notion of a house arrangement formed by a kitchen, family room, bedroom, and hallway. Semantics, features, and shape recognition typically resolve any confusion about which region belongs with which space but geometrically and analytically they are undefined. The product structure must be resolved visually. To ask the question, "What is the area of the kitchen floor?", would generally suggest to the CAD operator that the kitchen floor must be modeled with different geometry than that used to model the family room and hallway. Thus, the area of the kitchen floor becomes the area of the surface. This assumption of geometry and space falls apart when other relevant disciplines become involved. During construction of a house, the plywood floor panels, carpeting, and drywall, are independent of these other spatial designations. So to layout a grid of plywood panels on the floor surface would require a different geometric representation. The issue becomes more complicated with more complicated models.

Ask the question, "What is the area of the roof of a car"? To resolve these issues, it is important to realize that semantics can be universally understood but not explicitly defined. Thus, everyone recognizes that the roof of a car is the somewhat flat region above the space where you sit, but where the roof ends and the roof pillars begin is not defined. Current topology models do not allow for the construction of a product model that can define the kitchen floor or the roof of a car without unique, explicit, and redundant representation.

The GOBS structure allows for the extension of all representations into a common topology using non-manifold models with support for manifold and non-manifold "views". Such topology will also allow for future extensions, which will include additional n-dimensional objects and composition functions. These extensions will allow more flexibility in deseritization for physics based analysis, variational or time dependent analysis mappings, and allow more complete representations of product structure in general. The GOBS model utilizes a unique structure that allows geometry to be treated as a view of analytic functions, which satisfy the constraints of typical geometric entities. An example is the representation of trimmed surfaces. Currently CAD systems today consider a trimmed surface to be composed of a surface geometry bounded by a single outer boundary and any number of inner boundaries. This model does not allow the surface to be used as an entity to any other trimmed surface. It requires that a copy of that surface be made. GOBS, on the other hand, allows topological views of a trimmed surface where the view contains reference to one surface, one outer loop, and any number of inner loops. Thus, trimmed surface topological views of the kitchen floor, family room, hallway, etc. could be constructed using a single surface covering the entire floor and the boundaries depicting space, or any other subdivision of the floor surface. If these spaces do not satisfy the constraints of topological views they can be grouped as common views. Examples of additional spatial decompositions in common views could be "livable space", "carpeted space", "arrangeable space", etc.

GOBS includes relational elements that allow for the connection of entities through geometric reference and related through algorithmic functions. The wall between the family room and the bedroom as depicted in FIG. 5 is attached to the floor. The wall may span multiple floors but it contains a geometric intersection with the floor. To better understand how these relational elements are composed, the following GOBS definitions of the class elements and their associations is presented.

Factory (GobsFactory)
    Manages Gobs Structures

Structure (GobsStructure)
    A Structure object creates and manages all Gobs objects that geometrically describe the design object. A Structure can be viewed as a collection of connected objects or entities that compose a part or structure.

Common View (GobsCommonView)
    A Common View object groups Topological View objects and/or other Common View objects into a logical view of a Structure object. Objects may be members of multiple Common Views.

Topological View (GobsTopologicalView)
    A Topological View object is a Surface object, a Face object, or a Solid object. Topological Views have Characteristic and Property objects.

Solid (GobsSolid)
    A Solid object is a boundary-representation solid whose boundaries are Oriented Closed Shell objects.

Face (GobsFace)
    A Face object is a part of a Surface object defined by Edge Loop objects.

Surface (GobsSurface)
    A Surface object is a non-uniform rational b-spline representation of a surface.

Pcurve (GobsPcurve)
    A Pcurve object is a parametric curve on a Surface object. Its range is the domain of the Surface it is mapped to.

Ppoint (GobsPpoint)
    A Ppoint object is a point on a Pcurve object.

CoPoint (GobsCoPoint)
    A CoPoint object is a collection of Ppoint objects that a the same point in model space.

Edge (GobsEdge)
    A Edge object is a segment of a Pcurve object defined by two Ppoints.

CoEdge (GobsCoEdge)
    A CoEdge object is collection of Edge objects that represent the same model space edge. A CoEdge contains a single n-dimensional function that contains the domain space of each member Edge as range variables of its function.

Edge Loop (GobsEdgeLoop)

A Edge Loop object contains a series of connected Edge objects that form a closed loop.

Oriented Closed Shell (GobsOrientedClosedShell)

A Oriented Closed Shell object is a collection of Face objects that form a closed shell.

Cartesian Point (GobsCartesianPoint)

A Cartesian Point is a point in Cartesian space.

Characteristic (GobsCharacteristic)

A Characteristic object contains Property objects and/or other Characteristic objects.

Property (GobsProperty)

A Properly object contains an attribute's name and data. The foregoing classes and their associations are diagrammed in FIGS. 6–12, using Unified Modeling Language notation.

The present invention involves the use of connectors (i.e. GOBS CoEdges) and topological views (i.e. GOBS TopologicalViews).

Figure 13:
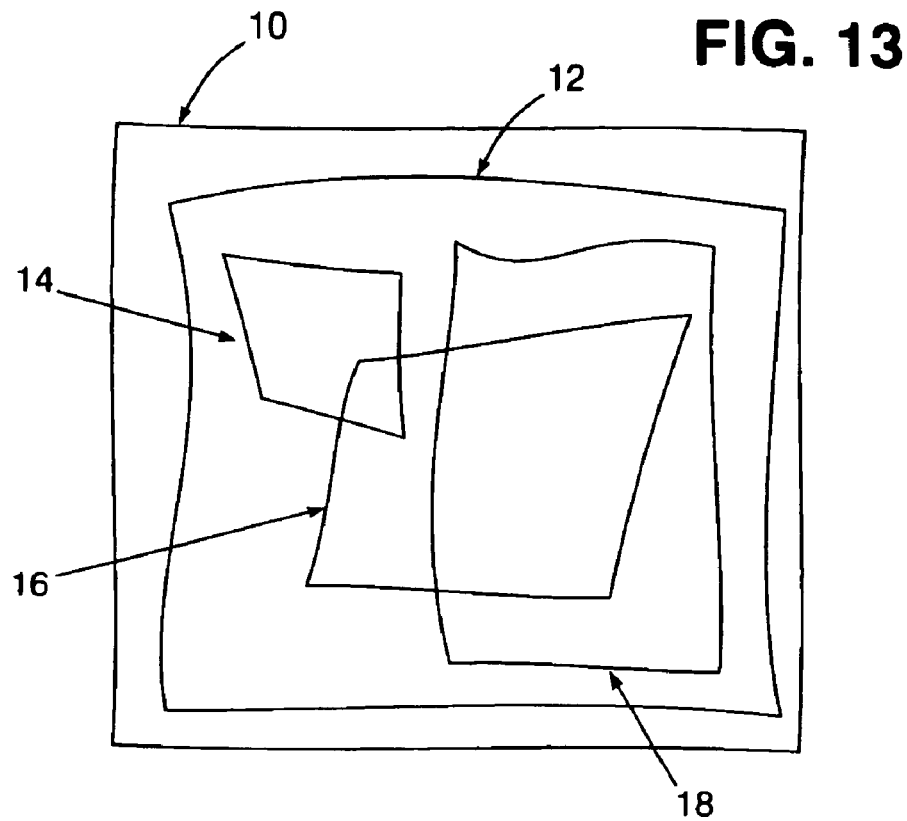
FIG. 13 illustrates boundary element candidates for construction of a topological view of surface type of physical structure from which data is extracted for geometrical modeling, and physical properties are associated in accordance with the present invention.

FIG. 13 illustrates by way of example a topological view of a two-dimensional base surface 10 of which four parametric boundary elements exist. Several closed loop boundaries 12, 14, 16, and 18 are defined as composition functions on surface 10. A total of eight possible topological views could be composed from these topology elements. Four trimmed surfaces with no inner boundaries and outer boundaries 12, 14, 16, and 18 are possible. Four trimmed surfaces with a single outer boundary 12 and their respective inner boundaries include (14 and 18), (14), (16), and (18). Since each pair of inner loops (14 and 16) or (16 and 18) are intersecting as shown in FIG. 13, such pairs of inner boundaries are not used for mapping pursuant to the present invention, which excludes self intersecting boundaries as well as any boundary intersecting another boundary.

Fundamental to the GOBS topology, the CoEdge provides a unique role in the connection of boundaries necessary for robust topologies. A CoEdge's function is to know all edges located on each surface and declares them to be equivalent in Cartesian space. It also contains an n-dimensional spline function which maps the parameterization of each edge into a single function This allows for the continuity of points along one surface to migrate to another surface without having to perform closest point approximations.

Figure 14:
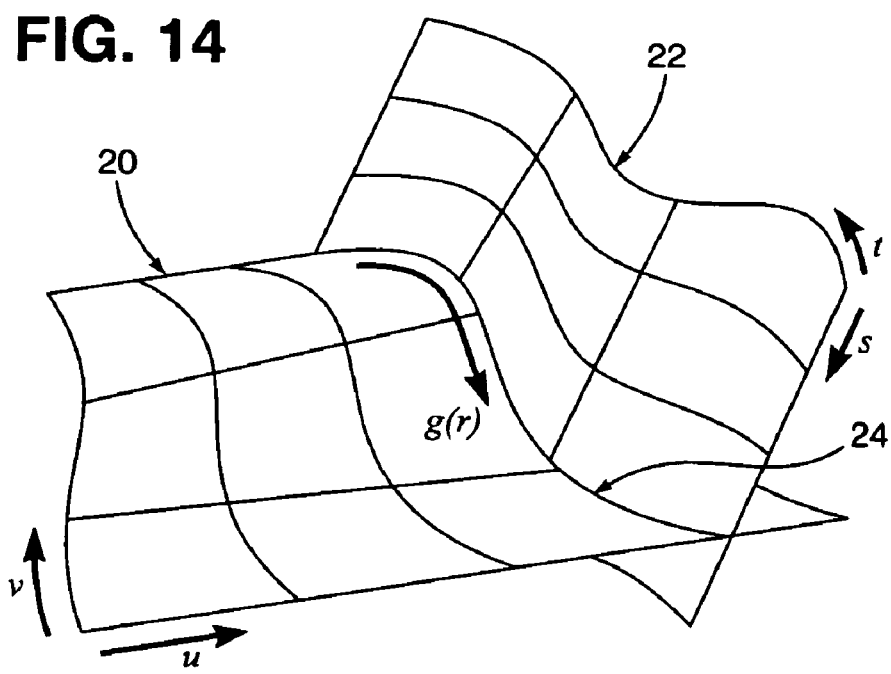
FIG. 14 illustrates a connector object of type CoEdge utilized for connecting topological views of type face.
Figure 15A:
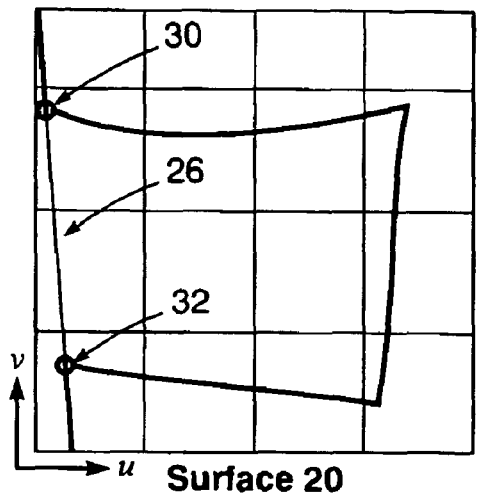
FIGS. 15A and 15B are two dimensional domain views of parametric space illustrating the CoEdge relationship between different topological views shown in FIG. 14.
Figure 15B:
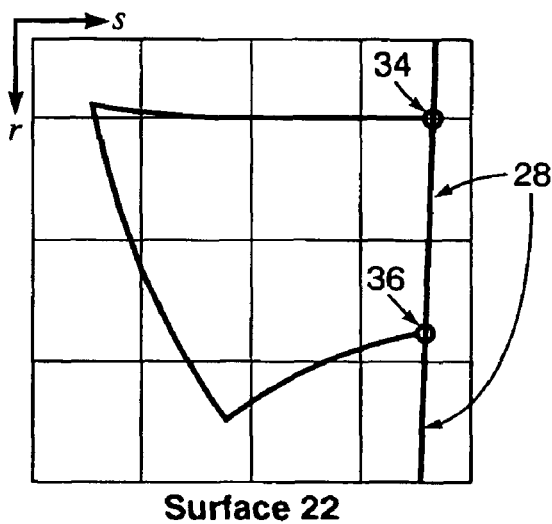

Pursuant to this invention, a connector object is illustrated in FIG. 14 showing two surface objects 20 and 22 connected to each other along a single intersection 24 between the curved surfaces of such objects, referred to as a CoEdge connector, which is expressed in terms of a multidimensional function that maps both the physical intersection and the parametric domains of their respective edge boundaries. Domain plots of the surfaces 20 and 22 and the underlying topology elements of the CoEdge connector are respectively diagrammed in FIGS. 15A and 15B with bounded parametric edge curves 26 and 28 respectively having parametric point boundaries 30, 32, and 34, 36. These parametric points, called GOBS Ppoints, are defined as a parametric location in the domain of curves 26 and 28. A connector object of type GOBS CoPoint maps 30 and 34 to a Cartesian location in space and another CoPoint similarly maps 32 and 36 to a location in Cartesian space. The CoPoint declares the two parametric Ppoints to be the same location in Cartesian space much the same a the CoEdge does to parametric edges on different surfaces.

Connector objects are not limited to edge boundaries of topological view representation of type surface or face as that illustrated by way of example in FIGS. 13, 14, 15A and 15B. In regard to the connector function associated with the topological view diagrammed in FIG. 16, the connector function (g) is: $(i,j) \rightarrow (u, v, s, t)$. Here a connector object of type surface 42 is connecting and mapping the space between two overlapping surfaces 38 and 40. Three-dimensional solids or volumes, 44 and 45, illustrated in FIG. 17 are likewise related by a connector of type surface 46. The connector objects in FIG. 17 would have a functional relationship appearing, given the volume 44 defined as the spline function $(x1, y1, z1)=g(i,k,j)$ and the volume 45 defined as the spline function $(x2, y2, z2)=f(u,v,w)$, as $(i,j,k,u,v,w)=r(l,m)$. The construction of the connector would ensure that for a given (l,m) on function r a set of parametric locations (i,j,k,u,v,w) would be returned such that if evaluated against their respective functions g and f would return the same Cartesian location (x,y,z).

Figure 16:
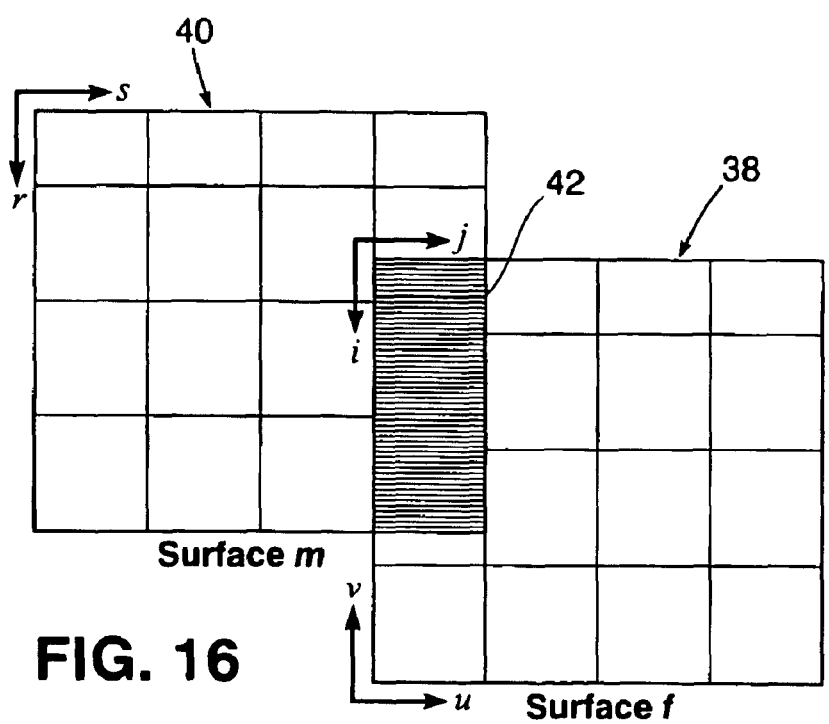
FIG. 16 illustrates a connector of type surface connecting overlapping topological views of type surface.
Figure 17:
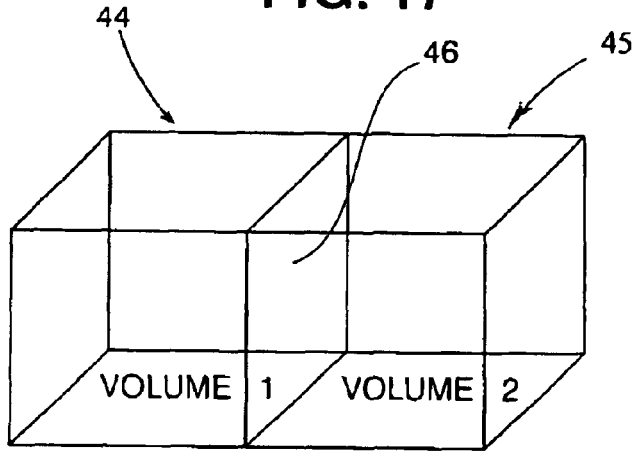
FIG. 17 illustrates two connected topological views of type volume where a topological view of type face bounds both.

Pursuant to the present invention, topological views of different geometrical structures respectively illustrated by way of example in FIGS. 14, 16 and 17, include connector objects providing logical and explicit connections for mapping domain to domain and domain to range between structural objects without being restricted by current geometric modeling methods to the dimensional function ($R^3$) denoting bounded regions of three dimensional Cartesian spaces. Based on the foregoing described topological view representations and the described mapping procedure associated therewith, a framework is established for different structures from a design environment for computational and geometrical modeling purposes.

Figure 18:
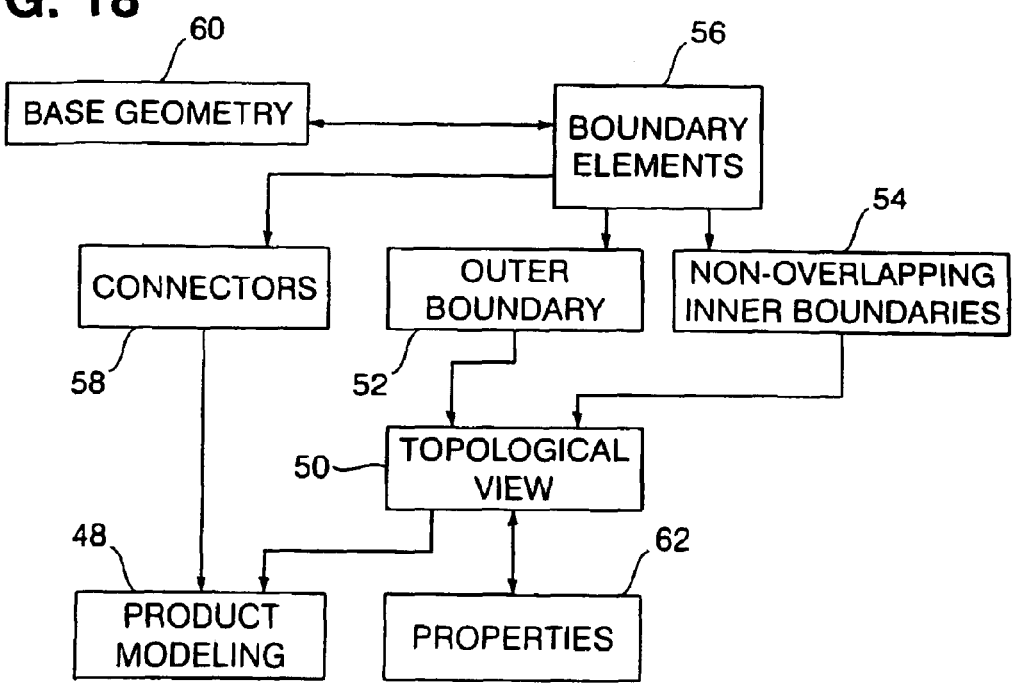
FIG. 18 is a block diagram of robust geometry showing application of topology elements and connectors necessary for "smart" product modeling.

FIG. 18 diagrammatically summarizes the procedure of the present invention as hereinbefore described, applicable to computer aided, geometric product modeling denoted by reference numeral 48. Such procedure involves product model representation; composed of connectors 58 and topological views 50. Such topological views are defined by outer boundary 52 and zero or more non-overlapping inner boundaries 54, whereby such boundaries are composed of individual boundary elements 56, so as to associate unique properties 62 within regions of the base geometry 60. The composition of product structure is made robust and associative through connectors 58 which mathematically relate boundary elements 56 across base geometry 60 domains.

Obviously, other modifications and variations of the present invention may be possible in light of the foregoing teachings. It is therefore to be understood that within the scope of the appended claims the invention may be practiced otherwise than as specifically described.

What is claimed is:

1. A method of product modeling used in computer-aided-design to represent physical bodies or product design from geometric entities of multiple dimensionality and topology, said method comprising the steps of:

defining by instantiation a geometric data entity,
wherein each of said geometric data entity is selected from a group consisting of at least one Cartesian location, at least one Ppoint entity, at least one Pcurve entity, at least one Edge entity, at least one CoEdge entity, at least one CoPoint entity, at least one EdgeLoop entity, at least one Surface entity, at least one Face entity, at least one OrientedClosed-Shell entity and at least one Solid entity;

establishing at least one Topological View using said geometric data entity to represent a physical region of a physical body or a product model;

defining a property for each of said Topological Views to represent a physical, functional or a behavioral characteristic of said region of said physical body or said product model; and wherein said Topological View is selected from the group consisting of said Face entity, Surface entity and Solid entity, defining said Surface entity with properties;

defining said Face entity with properties and EdgeLoop boundaries;

defining said Solid entity with properties and OrientedClosedShell entity boundaries;

defining said Surface entity properties, said Face entity properties and said Solid entity properties for each of said Topological Views to represent said physical, functional or behavioral characteristic or said region of said physical body or product model; and wherein a first parametric geometric base entity of said Ppoint is said Pcurve, wherein a second parametric geometric base entity of said Pcurve is said Surface entity, wherein said Edge entity is a segment of said Pcurve bounded by 2 Ppoints entities, wherein said EdgeLoop entity is at least one connected Edge entity that is a closed loop, and wherein said EdgeLoop entity is a boundary for said Face entity, defining an overlapping of at least two EdgeLoop boundaries sharing said Surface entity.

2. A method of product modeling used in computer-aided-design to represent physical bodies or product design from geometric entities of multiple dimensionality and topology, said method comprising the steps of:

defining by instantiation a geometric data entity, wherein each of said geometric data entity is selected from a group consisting of at least one Cartesian location, at least one Ppoint entity, at least one Pcurve entity, at least one Edge entity, at least one CoEdge entity, at least one CoPoint entity, at least one EdgeLoop entity, at least one Surface entity, at least one Face entity, at least one OrientedClosedShell entity and at least one Solid entity;

establishing at least one Topological View using said geometric data entity to represent a physical region of a physical body or a product model;

defining a property for each of said Topological Views to represent a physical, functional or a behavioral characteristic of said region of said physical body or said product model; and wherein said Topological View is selected from the group consisting of said Face entity, Surface entity and Solid entity, defining said Surface entity with properties;

defining said Face entity with properties and EdgeLoop boundaries;

defining said Solid entity with properties and OrientedClosedShell entity boundaries;

defining said Surface entity properties, said Face entity properties and said Solid entity properties for each of said Topological Views to represent said physical, functional or behavioral characteristic or said region of said physical body or product model; and wherein a first parametric geometric base entity of said Ppoint is said Pcurve, wherein a second parametric geometric base entity of said Pcurve is said Surface entity, wherein said Edge entity is a segment of said Pcurve bounded by 2 Ppoints entities, wherein said EdgeLoop entity is at least one connected Edge entity that is a closed loop, and wherein said EdgeLoop entity is a boundary for said Face entity, defining a sharing of an Edge entity by 2 or more EdgeLoop entities sharing said Surface entity.

3. A method of product modeling used in computer-aided-design to represent physical bodies or product design from geometric entities of multiple dimensionality, topology and connectivity said method comprising the steps of:

defining by instantiation a geometric data entity, wherein each of said geometric data entity is selected from a group consisting of at least one Cartesian location, at least one Ppoint entity, at least one Pcurve entity, at least one Edge entity, at least one CoEdge entity, and at least one CoPoint entity, establishing CoPoint entity connecting at least 2 Ppoints entities; and establishing CoEdge entity connecting at least 2 Edge entities;

wherein said CoPoint entity is a collection of Ppoints that is containing a Cartesian location in space, wherein said CoEdge entity is a collection of Edge entities that is a single curve in Cartesian space, and wherein said CoEdge entity contains a single n-dimensional function that contains the domain space of each Edge entity as a range coefficient of CoEdge function.

* * * * *